United States Patent

Baur et al.

Patent Number: 6,127,628
Date of Patent: Oct. 3, 2000

[54] PLASTIC HOUSING WITH A METAL INSERT IN A MOUNTING FLANGE

[75] Inventors: Richard Baur, Pfaffenhofen; Günter Fendt, Balthasar-Lacher-Str.; Engelbert Wörle, Kühbach, all of Germany

[73] Assignee: Temic Telefunken Microelectronic GmbH, Heilbronn, Germany

[21] Appl. No.: 09/130,317

[22] Filed: Aug. 7, 1998

[30] Foreign Application Priority Data

Aug. 7, 1997 [DE] Germany ............... 197 34 128

[51] Int. Cl.⁷ ............................................. H05K 5/02
[52] U.S. Cl. ............................................. 174/51
[58] Field of Search ................... 174/50, 65 R, 174/51

[56] References Cited

U.S. PATENT DOCUMENTS

| | | | |
|---|---|---|---|
| 4,202,457 | 5/1980 | Tansi | 220/3.3 |
| 4,392,012 | 7/1983 | Nattel | 174/51 |
| 5,066,832 | 11/1991 | Clarey et al. | 174/50 |
| 5,280,132 | 1/1994 | Clarey et al. | 174/50 |
| 5,352,850 | 10/1994 | Norris | 174/51 |
| 5,519,169 | 5/1996 | Garrett et al. | 174/51 X |
| 5,661,264 | 8/1997 | Reiker | 174/50 |
| 5,678,866 | 10/1997 | Mina | 174/65 R X |

FOREIGN PATENT DOCUMENTS

| | | |
|---|---|---|
| 3916899A1 | 11/1990 | Germany. |
| 4131779A1 | 3/1993 | Germany. |
| 9393091 U | 7/1993 | Germany. |
| 2 216 166 | 10/1989 | United Kingdom. |

*Primary Examiner*—Dean A. Reichard
*Attorney, Agent, or Firm*—Venable; Norman N. Kunitz; Leo J. Jennings

[57] ABSTRACT

A plastic housing with a sleeve-shaped metal insert has a mounting side for attachment to a mounting side of a metal carrier body by a connector element. The plastic housing has a mounting flange defining an opening and a top edge of the flange. The sleeve-shaped metal insert is arranged in the opening of the mounting flange, and has a top edge extending over the top edge of the mounting flange and an opening therethrough. The plastic housing has projecting plastic material on the mounting side of the mounting flange which provides a spacing between the sleeve-shaped metal insert and the metal carrier body by enclosing in the shape of a ring the lower edge of the opening in the mounting flange. The projecting plastic material insulates the sleeve-shaped metal insert from the metal carrier body and provides a seal against the effects of moisture.

6 Claims, 1 Drawing Sheet

6,127,628

PLASTIC HOUSING WITH A METAL INSERT IN A MOUNTING FLANGE

BACKGROUND OF THE INVENTION

The invention relates to a plastic housing for locating an electrical printed circuit board.

Increasingly, and in particular in the automotive industry, electronic modules are being made with plastic housings because, apart from their relatively simple and low-cost manufacture, they are in particular considerably lighter, and this in turn results in lower fuel consumption. For fastening the plastic housing to a metal carrier body, the plastic housing generally has a mounting flange with an opening. However, since the mounting flange of the plastic housing can very easily be deformed or damaged at the opening due to forces applied at the time of mounting, for instance when driving in screws or riveting, a metal insert is used in order to increase the transmissible forces, as described for example in DE 39 16 899 A1. Furthermore, DE 41 31 779 A1 describes a screwed fastening where a bush for a recessed-collar head screw is situated in a housing cover.

It is a disadvantage of metal inserts that a chemical contact junction can be created at the junction between metal insert and metal carrier body if these are made of different metals or metal alloys. A voltage, the magnitude of which depends on the electrochemical series, builds up between these as a result of moisture and electrolyte and this can lead to faults in electrical components inside the plastic housing or permanent damage to the junction point. It is known from the Code of Practice 1.031 of the Corrosion Working Group that plastic washers and insulating binders are used for this case, as described for example in the utility patent G 93 03 091 U1.

However, such additional plastic components call for additional placing, adjustment and assembly steps which considerably increase the cost of assembly.

SUMMARY OF THE INVENTION

The invention provides for a plastic housing which avoids the above-mentioned disadvantages in a particularly simple way.

On the mounting flange of the plastic housing, an insulating plastic portion is provided on the mounting side that insulates the metal insert from the carrier body. The insulating plastic portion has an opening which is centered to the opening in the metal insert. The diameter of the opening in the insulating plastic portion is equal to or greater than the opening in the metal insert so that the connecting element for mounting the mounting flange to the carrier body can be passed through beyond the insulating plastic portion. The diameter of the openings in the insulating plastic portion is smaller than the outside diameter of the metal insert in the mounting flange because this provides not only insulation but also a holding function of the insulating plastic portion for the metal insert. Consequently, the arrangement can be mounted more easily and possibly it will not be necessary to press in the metal insert into the mounting flange.

In the preferred embodiment, the thickness of the insulating plastic portion towards the carrier body is between 0.1 and 0.5 mm. When the insulating plastic portion is as thin as this, it deforms only very slightly while the connecting element is being connected and effectively represents a seal.

DESCRIPTION OF THE PREFERRED EMBODIMENTS

Figure 1:
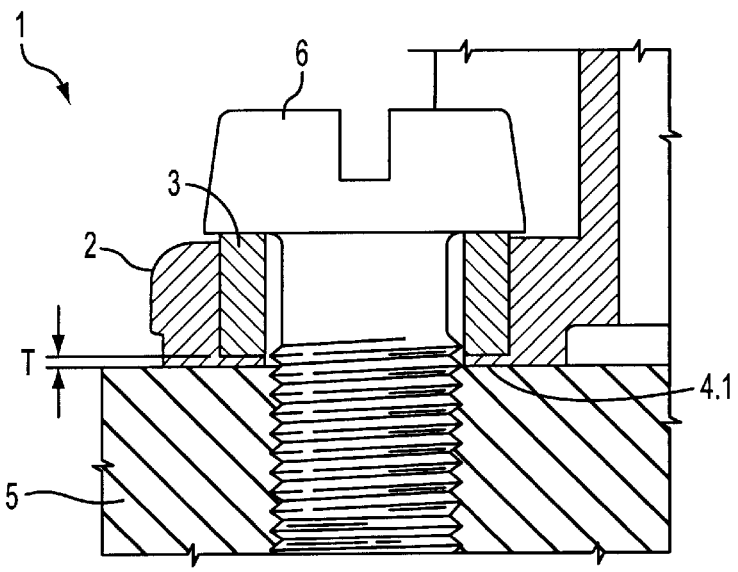
FIG. 1 is a sectional view through a mounting flange with an insulating plastic portion having a central constriction at one end to prevent contact between the metal insert and the carrier body.

FIG. 1 illustrates a plastic housing 1 on which there is a mounting flange. In principle, a plastic housing can of course have several such mounting flanges which are all similarly provided with an insulating plastic portion. In the mounting flange 2, there is the metal insert 3 which is insulated with respect to the metal carrier body 5 by the insulating plastic portion 4.1 and protected to a great extent against the effects of moisture. The insulating plastic portion provides together with the mounting flange a plane surface towards the metal carrier body. The insulating plastic portion acts effectively like a thin sealing skin which in this embodiment has been selected with a thickness of 0.2 mm indicated by the thickness labeled T. The insulating plastic portion has an opening for the connecting element 6 which can be, for example, a screw or a rivet. The diameter of the openings in the insulating plastic portion is however smaller than the outside diameter of the metal insert in the mounting flange.

Figure 2:
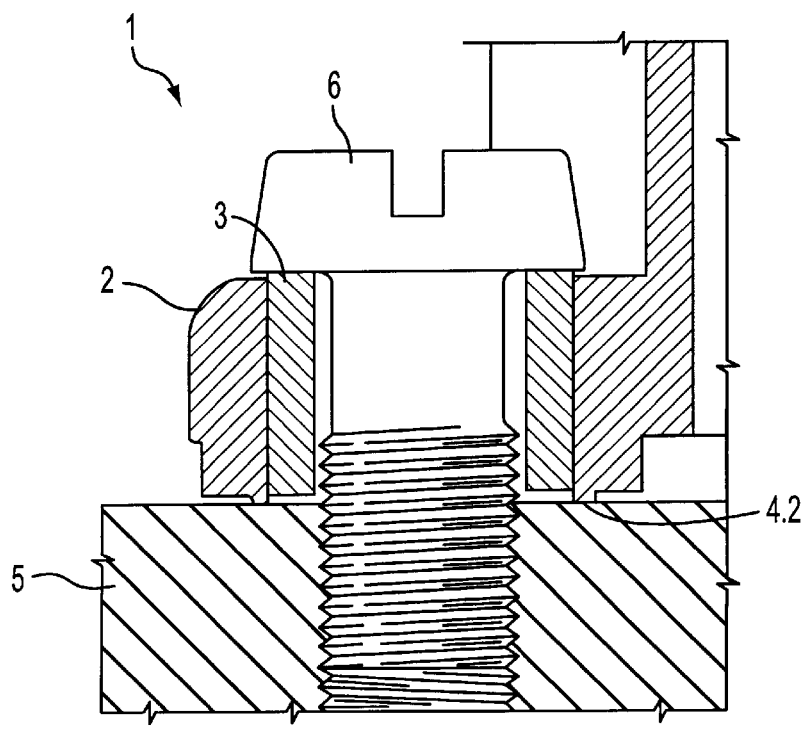
FIG. 2 is a section view of a mounting flange with an insulating plastic portion that has a protrusion at one end to prevent contact between the metal insert and the carrier body.

FIG. 2 also shows a plastic housing 1 with a mounting flange 2 in which there is a metal insert 3. In this embodiment, the insulating plastic portion 4.2 is placed on the mounting side of the plastic flange and of the metal insert as an insulation layer. The insulating plastic portion 4.2 is centered with respect to the opening in the metal insert 3 and has a uniform thickness.

What is claimed is:

1. A plastic housing having a sleeve-shaped metal insert and having a mounting side for attachment to a mounting side of a metal carrier body by a connector element extending through an opening in the metal insert, the plastic housing comprising:

a mounting flange having a mounting side, a top edge, and a lower edge and defining an opening therethrough, wherein the sleeve-shaped metal insert is arranged in the opening of the mounting flange, so that a top edge of the sleeve-shaped metal insert extends over the top edge of the mounting flange, and wherein the plastic housing has projecting plastic material on the mounting side of the mounting flange which provides a spacing between the sleeve-shaped metal insert and the metal carrier body by enclosing in the shape of a ring the lower edges of the opening in the mounting flange, so that the projecting plastic material insulates the sleeve-shaped metal insert from the metal carrier body and provides a seal against the effects of moisture.

2. A plastic housing in accordance with claim 1, wherein the projecting plastic material has an opening centered with respect to the opening in the metal insert and a diameter of the opening in the insulating plastic portion is equal to or greater than a diameter of the opening in the metal insert.

3. A plastic housing in accordance with claim 1, wherein a diameter of the opening in the projecting plastic material is smaller than an outside diameter of the metal insert in the mounting flange.

4. A plastic housing in accordance with claim 2, wherein the diameter of the opening in the projecting plastic material is smaller than an outside diameter of the metal insert in the mounting flange.

5. A plastic housing in accordance with claim 3, wherein a thickness of the projecting plastic material is between 0.1 and 0.5 mm.

6. A plastic housing in accordance with claim 4, wherein a thickness of the projecting plastic material is between 0.1 and 0.5 mm.

* * * * *